US010149363B2

(12) United States Patent
Yan et al.

(10) Patent No.: US 10,149,363 B2
(45) Date of Patent: Dec. 4, 2018

(54) METHOD FOR MAKING TUNABLE MULTI-LED EMITTER MODULE

(71) Applicant: LedEngin, Inc., San Jose, CA (US)

(72) Inventors: Xiantao Yan, Palo Alto, CA (US); Kachun Lee, Fremont, CA (US); David Tahmassebi, Los Gatos, CA (US)

(73) Assignee: LedEngin, Inc., San Jose, CA (US)

( * ) Notice: Subject to any disclaimer, the term of this patent is extended or adjusted under 35 U.S.C. 154(b) by 151 days.

(21) Appl. No.: 15/144,747

(22) Filed: May 2, 2016

(65) Prior Publication Data

US 2016/0249431 A1 Aug. 25, 2016

Related U.S. Application Data

(62) Division of application No. 13/781,162, filed on Feb. 28, 2013, now Pat. No. 9,345,095.

(Continued)

(51) Int. Cl.

| | |
|---|---|
| ***G01R 31/18*** | (2006.01) |
| ***H05B 33/08*** | (2006.01) |
| ***H05B 33/10*** | (2006.01) |

(52) U.S. Cl.

CPC ....... *H05B 33/0857* (2013.01); *H05B 33/086* (2013.01); *H05B 33/0815* (2013.01); *H05B 33/10* (2013.01); *Y10T 29/49004* (2015.01)

(58) Field of Classification Search

CPC .... F21K 9/00; Y10S 362/80; Y10T 29/49004; G09G 2320/0626; G09G 2320/0693;

(Continued)

(56) References Cited

U.S. PATENT DOCUMENTS 5,959,316 A 9/1999 Lowery
6,127,783 A 10/2000 Pashley et al.
(Continued)

FOREIGN PATENT DOCUMENTS

DE 202013008967 2/2014
EP 2381474 10/2011
(Continued)

OTHER PUBLICATIONS

JP2017-528507, "Office Action", dated Oct. 24, 2017, 11 pages.
(Continued)

*Primary Examiner* — Thiem Phan
(74) *Attorney, Agent, or Firm* — Kilpatrick Townsend & Stockton LLP

(57) ABSTRACT

A method for making a light-emitting diode (LED) emitter module includes providing a substrate and providing two or more groups of LED dies disposed on the substrate. Each group has one or more LED dies, and each of the LED dies is coupled to an electrical contact and electrical paths are configured for feeding separate electrical currents to the groups of LED dies. The method also includes determining information associating a plurality output light colors with a corresponding plurality of combinations of electrical currents, each combination specifying a plurality of electrical current values, each electrical current value being associated with an LED die from one of the two or more groups of LED dies. The method also includes storing the information in the memory device, and providing a circuit for accessing the information in the memory device.

11 Claims, 11 Drawing Sheets

Related U.S. Application Data

(60) Provisional application No. 61/606,351, filed on Mar. 2, 2012.

(58) Field of Classification Search
CPC ....... G09G 3/32; B60Q 1/2696; F21S 41/141; F21S 43/14; H05K 2201/10106
USPC ........................... 29/593, 825, 829, 832, 846
See application file for complete search history.

(56) References Cited

U.S. PATENT DOCUMENTS

| | | | |
|---|---|---|---|
| 6,307,160 B1 | 10/2001 | Mei et al. | |
| 6,351,069 B1 | 2/2002 | Lowery et al. | |
| 6,495,964 B1 | 12/2002 | Muthu et al. | |
| 6,608,332 B2 | 8/2003 | Shimizu et al. | |
| 6,614,179 B1 | 9/2003 | Shimizu et al. | |
| 6,642,652 B2 | 11/2003 | Collins, III et al. | |
| 6,680,128 B2 | 1/2004 | Mei | |
| 6,777,883 B2 | 8/2004 | Mukherjee | |
| 6,791,116 B2 | 9/2004 | Takahashi et al. | |
| 6,828,170 B2 | 12/2004 | Roberts et al. | |
| 6,967,447 B2 | 11/2005 | Lim et al. | |
| 7,064,353 B2 | 6/2006 | Bhat | |
| 7,139,125 B1 | 11/2006 | Mi | |
| 7,156,538 B2 | 1/2007 | Han et al. | |
| 7,157,744 B2 | 1/2007 | Palmteer et al. | |
| 7,168,608 B2 | 1/2007 | Mei | |
| 7,199,446 B1 | 4/2007 | Mei et al. | |
| 7,230,222 B2 | 6/2007 | Cheng et al. | |
| 7,264,378 B2 | 9/2007 | Loh | |
| 7,465,069 B2 | 12/2008 | Li | |
| 7,473,933 B2 | 1/2009 | Yan | |
| 7,560,677 B2 * | 7/2009 | Lyons ...................... | G01J 1/32 250/205 |
| 7,670,872 B2 | 3/2010 | Yan | |
| 7,772,609 B2 | 8/2010 | Yan | |
| 8,013,533 B2 | 9/2011 | De Rijck et al. | |
| 8,075,165 B2 | 12/2011 | Jiang et al. | |
| 8,344,629 B2 | 1/2013 | Deixler | |
| 8,384,097 B2 | 2/2013 | Yan | |
| 8,517,550 B2 * | 8/2013 | Ramer ..................... | F21K 9/00 362/84 |
| 8,598,793 B2 | 12/2013 | Yan et al. | |
| 8,773,024 B2 | 7/2014 | Yan et al. | |
| 9,345,095 B2 | 5/2016 | Yan et al. | |
| 2001/0015778 A1 | 8/2001 | Murade et al. | |
| 2002/0004251 A1 | 1/2002 | Roberts et al. | |
| 2002/0015013 A1 | 2/2002 | Ragle | |
| 2002/0047624 A1 | 4/2002 | Stam et al. | |
| 2002/0163006 A1 | 11/2002 | Yoganandan et al. | |
| 2002/0191885 A1 | 12/2002 | Wu et al. | |
| 2003/0016899 A1 | 1/2003 | Yan | |
| 2003/0086674 A1 | 5/2003 | Yan et al. | |
| 2003/0095399 A1 | 5/2003 | Grenda et al. | |
| 2003/0116769 A1 | 6/2003 | Song et al. | |
| 2003/0122482 A1 | 7/2003 | Yamanaka et al. | |
| 2003/0227249 A1 | 12/2003 | Mueller et al. | |
| 2003/0230977 A1 | 12/2003 | Epstein | |
| 2004/0004437 A1 | 1/2004 | Shimizu et al. | |
| 2004/0051111 A1 | 3/2004 | Ota et al. | |
| 2004/0079957 A1 | 4/2004 | Andrews et al. | |
| 2004/0087165 A1 | 5/2004 | Theiss et al. | |
| 2004/0102061 A1 | 5/2004 | Watanabe | |
| 2004/0114393 A1 | 6/2004 | Galli | |
| 2004/0126918 A1 | 7/2004 | Kurahashi et al. | |
| 2004/0150991 A1 | 8/2004 | Ouderkirk et al. | |
| 2004/0173810 A1 | 9/2004 | Lin et al. | |
| 2004/0201025 A1 | 10/2004 | Barnett et al. | |
| 2004/0257496 A1 | 12/2004 | Sonoda et al. | |
| 2005/0035364 A1 | 2/2005 | Sano et al. | |
| 2005/0093146 A1 | 5/2005 | Sakano | |
| 2005/0127281 A1 | 6/2005 | Zheng et al. | |
| 2005/0128751 A1 | 6/2005 | Roberge et al. | |
| 2005/0145872 A1 | 7/2005 | Fang et al. | |
| 2005/0179376 A1 | 8/2005 | Fung et al. | |
| 2005/0199900 A1 | 9/2005 | Lin et al. | |
| 2005/0224830 A1 | 10/2005 | Blonder et al. | |
| 2005/0253242 A1 | 11/2005 | Costello et al. | |
| 2005/0286131 A1 | 12/2005 | Saxena et al. | |
| 2006/0002110 A1 | 1/2006 | Dowling et al. | |
| 2006/0012299 A1 | 1/2006 | Suehiro et al. | |
| 2006/0063287 A1 | 3/2006 | Andrews | |
| 2006/0082296 A1 | 4/2006 | Chua et al. | |
| 2006/0082679 A1 | 4/2006 | Chua et al. | |
| 2006/0091416 A1 | 5/2006 | Yan | |
| 2006/0091788 A1 | 5/2006 | Yan | |
| 2006/0097385 A1 | 5/2006 | Negley | |
| 2006/0170332 A1 | 8/2006 | Tamaki et al. | |
| 2006/0284209 A1 | 12/2006 | Kim et al. | |
| 2007/0023769 A1 | 2/2007 | Nishimoto et al. | |
| 2007/0081360 A1 | 4/2007 | Bailey et al. | |
| 2007/0139437 A1 | 6/2007 | Boroson et al. | |
| 2007/0170449 A1 | 7/2007 | Anandan | |
| 2007/0194341 A1 | 8/2007 | Chang et al. | |
| 2007/0235639 A1 | 10/2007 | Rains, Jr. | |
| 2007/0241357 A1 | 10/2007 | Yan | |
| 2007/0295975 A1 | 12/2007 | Omae | |
| 2008/0088244 A1 | 4/2008 | Morishita | |
| 2008/0149962 A1 | 6/2008 | Kim et al. | |
| 2008/0308825 A1 | 12/2008 | Chakraborty et al. | |
| 2009/0316409 A1 | 12/2009 | Kim et al. | |
| 2010/0060185 A1 | 3/2010 | Van Duijneveldt | |
| 2010/0066255 A1 | 3/2010 | Roberts | |
| 2010/0259930 A1 | 10/2010 | Yan | |
| 2011/0012512 A1 | 1/2011 | Young et al. | |
| 2011/0178582 A1 | 7/2011 | Dougal | |
| 2011/0248289 A1 | 10/2011 | Hsieh et al. | |
| 2011/0291135 A1 | 12/2011 | Hsieh et al. | |
| 2012/0286669 A1 | 11/2012 | Yan et al. | |
| 2012/0306370 A1 | 12/2012 | Van De et al. | |
| 2013/0026511 A1 | 1/2013 | Yeh et al. | |
| 2013/0093354 A1 | 4/2013 | Jiang | |
| 2013/0229125 A1 | 9/2013 | Yan et al. | |
| 2014/0209939 A1 | 7/2014 | Yan | |
| 2015/0061508 A1 | 3/2015 | Yan et al. | |

FOREIGN PATENT DOCUMENTS

| | | |
|---|---|---|
| JP | 2000349346 | 12/2000 |
| JP | 2000349347 | 12/2000 |
| JP | 2001057445 | 2/2001 |
| JP | 2002185046 | 6/2002 |
| JP | 2004241704 | 8/2004 |
| JP | 2004253404 | 9/2004 |
| JP | 2009520233 | 5/2009 |
| JP | 2013510439 | 3/2013 |
| KR | 20110118523 | 10/2011 |
| KR | 1020110118523 | 10/2011 |
| KR | 20140121214 | 10/2014 |
| WO | 2006001352 | 1/2006 |
| WO | 2014110396 | 7/2014 |

OTHER PUBLICATIONS

Solvent Soluble Polyimide with High Transparency and High Tg: HOP-400, 500, Hitachi Cable Review, vol. 22, Aug. 2003, p. 78.

Kading, Thermal conduction in metallized silicon-dioxide layers on silicon, Appl.Phys. Lett 65, vol. 13, Sep. 26, 1994, pp. 1629-1631.

Yan et al., Analysis Based Design Guidelines for Metal Runner and Passivation Layers in IC Packaging, Delphi Automotive Systems Analytical Engineering Conference, May 2000, p. 1.

Yan et al., Two Test Specimens for Determining the Interfacial Fracture Toughness in Flip-Chip Assemblies, Transactions of the ASME,Journal of Electronic Packaging, vol. 120, Issue 2, Special Section Technical Papers, Jun. 1, 1998, pp. 150-155.

Chinese Application No. 201010149882.X, Office action dated Mar. 5, 2012, 12 pages. (6 pages for the original document and 6 pages for the English translation).

European Application No. 12166091.4, Extended European Search Report dated Jul. 18, 2013, 7 pages.

(56) References Cited

OTHER PUBLICATIONS

Japanese Application No. 2005315149, Office Action dated Jul. 21, 2009, 3 pages.
U.S. Appl. No. 12/756,861, Notice of Allowance dated Oct. 19, 2012, 7 pages.
U.S. Appl. No. 12/756,861, Office Action dated Jan. 18, 2012, 18 pages.
U.S. Appl. No. 13/106,808, Notice of Allowance dated Jul. 25, 2013, 9 pages.
U.S. Appl. No. 13/774,414, Notice of Allowance dated Dec. 23, 2013, 10 pages.
U.S. Appl. No. 13/781,162, Non-Final Office Action dated Jun. 18, 2015, 8 pages.
U.S. Appl. No. 13/781,162, Notice of Allowance dated Jan. 13, 2016, 8 pages.
U.S. Appl. No. 13/781,162, Restriction Requirement dated Jan. 29, 2015, 6 pages.
U.S. Appl. No. 13/106,808, Non-Final Office action dated Apr. 12, 2013, 10 pages.
U.S. Appl. No. 14/231,406, Final Office Action dated Nov. 20, 2015, 19 pages.
U.S. Appl. No. 14/231,406, Non-Final Office Action dated Feb. 3, 2015, 14 pages.
U.S. Appl. No. 14/322,841, Notice of Allowance dated Jan. 13, 2015, 9 pages.
European Application No. EP15862365.2, "Extended European Search Report", dated Feb. 20, 2018, 5 pages.
Japan Application No. JP2017-528507, "Office Action," dated Jun. 19, 2018, 9 pages.

* cited by examiner

METHOD FOR MAKING TUNABLE MULTI-LED EMITTER MODULE

CLAIM OF PRIORITY

The present application is a divisional of, and claims benefit and priority to U.S. application Ser. No. 13/781,162, filed Feb. 28, 2013, entitled "TUNABLE MULTI-LED EMITTER MODULE" (now U.S. Pat. No. 9,345,095), which claims the benefit and priority under 35 U.S.C. 119(e) of U.S. Provisional Application No. 61/606,351, filed Mar. 2, 2012, the contents of which are hereby incorporated by reference for all purposes.

CROSS-REFERENCE TO RELATED APPLICATIONS

The present application is also related to U.S. patent application Ser. No. 12/756,861, filed Apr. 8, 2010, entitled "PACKAGE FOR MULTIPLE LIGHT EMITTING DIODES," now U.S. Pat. No. 8,384,097, and U.S. patent application Ser. No. 13/106,808, filed May 12, 2011, entitled "TUNING OF EMITTER WITH MULTIPLE LEDS TO A SINGLE COLOR BIN," now U.S. Pat. No. 8,598,793, the disclosures of both of which are incorporated by reference herein in their entirety.

BACKGROUND OF THE INVENTION

The present invention relates in general to lighting devices based on light-emitting diodes (LEDs) and in particular to tunable emitter modules that include multiple LEDs.

LEDs are a promising technology more energy efficient than incandescent light bulbs and are already widely deployed for specific purposes, such as traffic signals and flashlights. However, the development of LED-based lamps for general illumination has run into various difficulties. Among these is the difficulty of mass-producing lamps that provide a consistent color temperature.

As is known in the art, not all white light is the same. The quality of white light can be characterized by a color temperature, which ranges from the warm (slightly reddish or yellowish) glow of standard tungsten-filament light bulbs to the cool (bluish) starkness of fluorescent lights. Given existing processes for LED manufacture, mass-producing white LEDs with a consistent color temperature has proven to be a challenge.

Various solutions have been tried. For example, white LEDs can be binned according to color temperature and the LEDs for a particular lamp can be selected from the desired bin. However, the human eye is sensitive enough to color-temperature variation that a large number of bins is required, with the yield in any particular bin being relatively low. Another solution relies on mixing different colors of light to produce a desired temperature. However, this approach can be expensive and not reliable.

Therefore, there is a need for a multiple-LED emitter module that can be tuned to provide desired light colors.

BRIEF SUMMARY OF THE INVENTION

Embodiments of the present invention relate to emitter modules tunable emitter modules that include multiple LEDs and embedded information for tuning the color of light. Particular embodiments are adapted for use with emitter modules that include two or more independently addressable groups of LEDs that each produce light of a different color or color temperature. The uniform color or color temperature output from the emitter module is tuned by varying input current to each of the groups of LEDs. In some embodiments, the emitter module also includes a memory device. The LEDs are pre-tested, and information relating the electrical current for each group of LEDs to the output light color is stored in the memory device. A controller can access this information and provides the correct amount of current to allow the emitter module to provide the desired light color.

Depending on the embodiments, one or more of the following advantages can be realized by embodiments of the invention. For example, the utilization of LED dies can be increased, because the LED dies that would otherwise be excluded by color binning can now be combined to produce the desired light color. For lamps using LEDs whose color is stable over time, the tuning can be performed once, e.g., during manufacture and/or factory testing of the lamp, and the lamp can thereafter operate at a stable color temperature without requiring active feedback components. In another example, output light of the emitter module can be varied to provide lighting for different occasions. The emitter module can be adapted by lamp manufacturers in many different applications.

According to an embodiment of the present invention, a light-emitting diode (LED) emitter module includes a substrate having a plurality of base layers of an electrically insulating material, a plurality of electrical contacts disposed on a top one of the base layer, and a plurality of electrical paths coupled to the electrical contacts, wherein at least a portion of the plurality of electrical paths is disposed between the base layers. The emitter module also includes two or more groups of light-emitting diodes (LEDs), each group having one or more LEDs, and each of the LEDs is coupled to an electrical contact. The electrical paths are configured for feeding separate electrical currents to the two or more groups of LEDs. The emitter module also includes a memory device containing information associating a plurality of output light colors with a corresponding plurality of combinations of electrical currents, each combination specifying an electric current for each of the two or more groups of LEDs. The emitter module further includes a circuit for accessing the information in the memory device.

In an embodiment of the above emitter module, the memory device is a non-volatile memory device. In an embodiment, the output light color is specified by a target wavelength within a wavelength range of no more than 10 nm. In an embodiment, the emitter module further includes a circuit for wired communication. In a different embodiment, the emitter module further includes a circuit for wireless communication. In some embodiments, the emitter module also includes a processor. In another embodiment, the emitter module also includes a processor and a PWM (pulse with modulation) control circuit. In yet another embodiment, the emitter module also includes a processor and an analog current splitter circuit.

In embodiments of the invention, the emitter module also includes a substrate on which the two or more groups of light-emitter diodes (LEDs) are disposed. In some embodiments, the memory device is disposed on the substrate. In some embodiments, the emitter module also includes a metal core printed circuit board (MCPCB) on which the substrate is disposed. In an embodiment, the memory device is disposed on the MCPCB. In some embodiments, the two or more groups of light-emitter diodes (LEDs) are configured as a single emitter having a single substrate and a single primary lens.

According to another embodiment of the invention, a light-emitting diode (LED) emitter module includes two or more groups of light-emitter diodes (LEDs), each group having one or more LEDs. The emitter module has connections for feeding electric current to each of the two or more groups of LEDs. The emitter module also includes a memory device containing at least information associating a plurality output light colors with a corresponding plurality of combinations of electrical current values, each combination specifying an electric current for each of the groups of LEDs. The emitter module also has a circuit for accessing to the information in the memory device, thereby allowing selection of output light colors.

Embodiments of the invention provides various lighting systems that include the emitter modules described above. For example, in an embodiment, a lighting system includes one of the emitter module described above and a driver module configured to access information stored in the memory device and to provide electrical current to the groups of LEDs. In another embodiment, a lighting system includes one of the emitter module described above, a controller configured to access information stored in the memory device, and a driver module configured to provide electrical current to the groups of LEDs based on information provided by the controller. In yet another embodiment, a lighting system includes one of the emitter module described above and a driver module configured to provide electrical current to the groups of LEDs. Here, the emitter module also has a processor configured to access information stored in the memory device and a control circuit configured to control the driver module. In still another embodiment, the control circuit further comprising a PWM (pulse with modulation) control circuit. In an alternative embodiment, the control circuit further comprising an analog current splitter circuit.

According to another embodiment of the invention, a method is provided for producing a target color using an LED emitter module having an LED emitter with two or more groups of LEDs and a memory device. The method includes reading, from the memory device, electrical current values for each of the two groups of LEDs for producing the target color and providing current to each of the two groups of LEDs based on the current values from the memory device.

According to yet another embodiment of the invention, a method for making an LED (light-emitter diode) emitter module includes providing an LED emitter having two or more groups of LEDs and a memory device, each group having one or more LEDs. The method also includes testing the two or more groups of LEDs to determine required current for each group for the emitter to output a target color. The method further includes storing information about the required current into the memory device.

A further understanding of the nature and advantages of the present invention may be realized by reference to the remaining portions of the specification and the drawings.

BRIEF DESCRIPTION OF THE DRAWINGS

FIG. 4A is a simplified top view of a substrate; FIG. 4B is a simplified cutaway top view of the substrate of FIG. 4A; FIG. 4C is a simplified schematic illustration of another configuration of electrical connections among certain components shown in FIG. 4B; and FIG. 4D is a bottom view of the substrate of FIG. 4A;

DETAILED DESCRIPTION OF THE INVENTION

The description below is presented with reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

Figure 1:
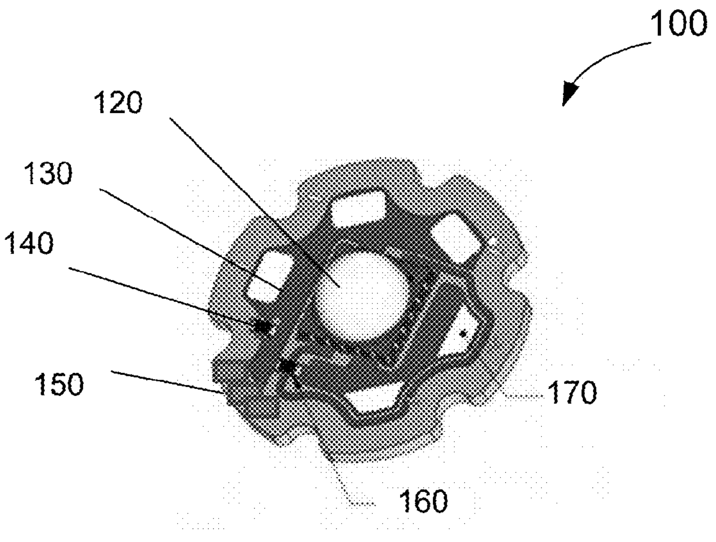
FIG. 1 is a perspective view illustrating a tunable multi-LED emitter module according to an embodiment of the present invention.

FIG. 1 is a perspective view illustrating a tunable multi-LED emitter module according to an embodiment of the present invention. As shown in FIG. 1, emitter module 100 includes a multiple-LED emitter 120 overlying a circuit board 130. Emitter 120 has two or more groups of light-emitter diodes (LEDs), with each group including one or more LEDs. As will be described below with reference to FIGS. 2A-4D, the groups of LEDs are individually addressable. In other words, each group can receive a different amount of electric current for adjusting its brightness. Emitter 120 also includes a plurality of contacts 170 for feeding electric current to the two or more groups of LEDs. By supplying different electrical currents to the groups of LEDs, emitter 120 can be configured to produce different output light colors.

Moreover, emitter 120 includes a memory device 140 that contains information about the characteristics of the emitter module. For example, memory device 140 can include at least information associating light colors with electrical currents. For example, memory device 140 may include information associating two or more output light colors with two or more corresponding combinations of electrical current values, each combination specifying an electric current for each of the two or more groups of LEDs. In some embodiments, the output light color is specified by a target wavelength within a range of, for example, 10 nm or 20 nm. The output light color can be varied according to the demand of the environment. For example, the output of emitter module 100 can be changed from warm white or cool white, or vice versa. Alternatively, by varying the current provided to difference groups of LEDs, emitter module 100 can provide light of any desirable color, or even patterns of different colors. Emitter module 100 can include circuits 160 for accessing the information in the memory device, thereby allowing tuning of output light colors.

Embodiments of the invention provides methods for producing a target color using a tunable LED emitter. In a specific embodiment, the emitter has two groups of LEDs, and the method includes reading electric current values that are stored in the memory device for each of the two groups of LEDs for producing the target color. The required current values are then provided to two or more drivers to cause the drivers to provide the required currents. In other embodiments, the emitter can have more than two groups of LEDs, the required current for a target color can be read from the memory device in the emitter module. More information about tuning the multi-LED emitter light color is described below with reference to FIGS. 2-3. Lighting systems incorporating the multi-emitter tunable LED module are described with reference to FIGS. 5-7.

In some embodiments, the memory device is a non-volatile memory device. For example, the memory device can include read-only memory (ROM), Flash memory, electrically-programmable memory (EPROM), or erasable electrically-programmable memory (EEPROM), etc.

In some embodiments, emitter 120 includes a substrate on which the two or more groups of light-emitter diodes (LEDs) are disposed. In an embodiment, the substrate has a plurality of base layers of an electrically insulating material, a plurality of electrical contacts disposed on a top one of the base layer, and a plurality of electrical paths coupled to the electrical contacts. At least a portion of the plurality of electrical paths is disposed between the base layers. Each of the LEDs being coupled to an electrical contact, and the electrical paths are configures for feeding separate electrical currents to the two or more groups of LEDs. Emitter module 100 can also include a circuit board 130, e.g., a metal core printed circuit board (MCPCB), on which the substrate is located. More details about the substrate and the circuit board are described below with reference to FIGS. 2-4.

Depending on the embodiment, memory device 140 can be disposed on the substrate or on the MCPCB 130. In some embodiments, emitter 120 has the two or more groups of light-emitter diodes (LEDs) configured as a single emitter having a single substrate and a single primary lens, as illustrated below in FIG. 2A.

In some embodiment, emitter module 100 also includes contact pads 150 coupled to circuits for communication, which enable access to information stored in memory device 140 and which enables control information to be provided to emitter module 100. Depending on the embodiment, the communication circuit can include wired interface circuits implementing the SPI (Serial Peripheral Interface) or i2C (Inter-Integrated Circuit, or two-wire interface) protocols. In alternative embodiments, the communication circuit can include wireless interface circuits, including antenna, for example, for communication in the infrared (IR) or radio frequency (RF).

Embodiments for tuning lamps with two independently addressable groups of LEDs are described below, and it is understood that the techniques can be extended to lamps with larger numbers of groups. As used herein, a "group" of LEDs refers to any set of one or more LEDs that occupies a defined region in color space; the regions are defined such that regions occupied by different groups in the same lamp do not overlap. The lamp is advantageously designed such that the current supplied to each group of LEDs can be controlled independently of the current supplied to other LEDs, and the groups are thus said to be "independently addressable."

Figure 2A:
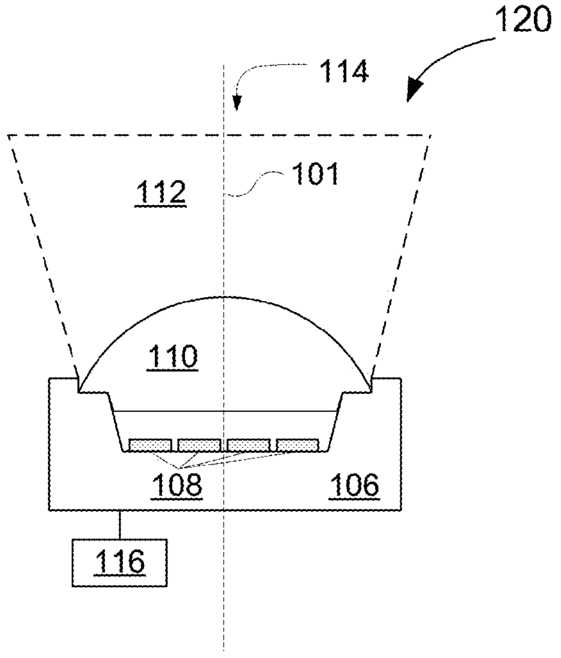
FIG. 2A is a simplified cross-sectional view illustrating a multi-LED tunable emitter that can be used in the tunable emitter module of FIG. 1 according to an embodiment of the present invention.

FIG. 2A illustrates a simplified cross-sectional side view of a multi-LED tunable emitter 120 that can be used in the tunable emitter module 100 of FIG. 1 according to an embodiment of the present invention. Emitter 120, which can be symmetric about an axis 101 (other shapes can also be used) and includes a substrate 106 on which are mounted individual LEDs 108. Each LED 108 can be a separate semiconductor die structure fabricated to produce light of a particular color in response to electrical current. In some embodiments, each LED 108 is coated with a material containing a color-shifting phosphor so that LED 108 produces light of a desired color. For example, a blue-emitting LED die can be coated with a material containing a yellow phosphor; the emerging mixture of blue and yellow light is perceived as white light having a particular color temperature.

In some embodiments, Emitter 120 also includes a control circuit 116 that controls, among other things, the power provided from an external power source (not shown) to LEDs 108. As described below, control circuit 116 advantageously allows different amounts of power to be supplied to different LEDs 108.

A primary lens 110, which can be made of glass, plastic, or other optically transparent material, is positioned to direct light emitted from LEDs 108 to the desired direction. In some embodiments, a secondary optics 112 (shown in dotted line) is disposed over primary lens. Secondary optics 112 advantageously include a total-internal-reflection (TIR) lens that also provides mixing of the colors of light emitted from LEDs 108 such that the light beam exiting through front face 114 has a uniform color. Examples of suitable lenses are described in U.S. Patent Application Pub. No. 2010/0091491; other color-mixing lens designs may also be used. In some embodiments, primary lens and secondary optics can be combined into one mixing lens structure. Tuning is advantageously performed based on the color of light exiting through front face 114 of TIR lens 112 or the front face of another mixing lens.

Embodiments of the present invention provide substrates and packages for LED-based light devices that can significantly improve thermal performance, allowing the LEDs to operate at higher current and therefore higher brightness. In addition, some embodiments provide improved electrical properties by providing separate electrical and thermal paths through the substrate. The separation of electrical and thermal paths further allows different operating current to be supplied to different LEDs, enhancing the ability to control the light output of the device.

Figure 2B:
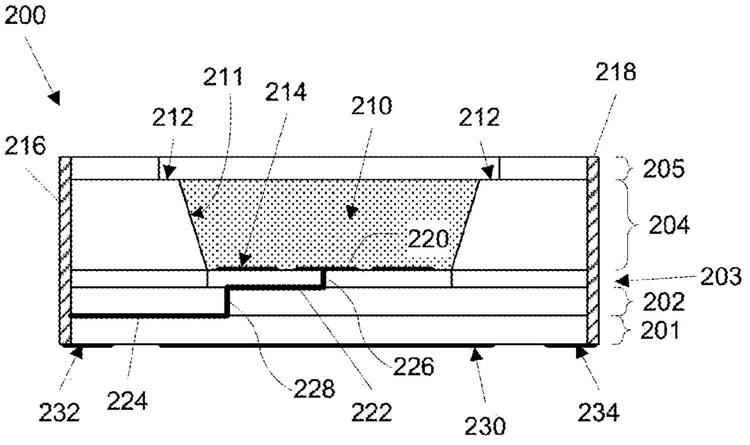
FIG. 2B is a simplified cross-sectional view illustrating a substrate for an LED emitter package according to an embodiment of the present invention.

FIG. 2B is a simplified side view of a substrate 200 for a multi-LED emitter according to an embodiment of the present invention. Substrate 200 is formed as a series of layers 201-205 of a ceramic material (e.g., alumina or aluminum nitride (AlN)). Layers 201-205 have different thicknesses that can be optimized to control thermal expansion and thermal stress. For example, layers 201 and 202 can be 0.15 millimeters (mm) each, layer 203 can be 0.10 mm, layer 204 can be 0.50 mm, and layer 205 can be 0.15 mm, for a total thickness of 1.05 mm.

Upper layers 204 and 205 define a recess 210 within which one or more LEDs (not shown) can be placed. In one embodiment, recess 210 has the shape of a truncated cone; sidewall 211 is circular and slanted inward, e.g., at an angle of about 20° with respect to the vertical axis. Sidewall 211 of recess 210 can be coated with a reflective material (e.g., silver) to increase light output of the device.

Upper layer 205 can provide a circular opening, allowing light to escape from recess 210. In this embodiment, the edge of layer 205 is set back from the edge of layer 204 at the periphery of recess 210, thereby forming a ledge 212 upon which a primary lens can be placed.

Layers 201-203 provide a base for the package. A patterned metal layer 214 is deposited on top-most base layer 203 within recess 210. Patterned metal layer 214 provides various bond pads (e.g., pad 220) for electrical contacts to LEDs disposed within recess 210. (These are referred to herein as "top-side" bond pads because they are on the topmost one of the base layers.) Specific examples are described below, but it will be appreciated that the present invention is not limited to any particular configuration of bond pads or of metal layer 214.

External electrical contacts 216, 218 are provided at a peripheral edge of substrate 200. In one embodiment, external contacts 216, 218 include metal coatings that extend vertically along the entire thickness of substrate 200. Any number of external contacts can be provided. Each top-side bond pad of patterned metal layer 214 can be connected to one (or more) of the external electrical contacts, e.g., using metal lines disposed between ceramic layers and metal vias passing through the ceramic layers. By way of illustration, FIG. 2B shows top-side bond pad 220 connected to external contact 216 by interlayer metal lines 222, 224 and vias 226, 228. Any configuration of connections may be used. Further, in some embodiments, some of the top-side bond pads can be connected to each other by interlayer metal lines and vias that do not connect to external electrical contacts. In some embodiments, as described below, the electrical connections are arranged such that power can be supplied separately to different LEDs or groups of LEDs. In some embodiments, external contacts 216, 218 may also extend inward on the bottom surface of substrate 200, e.g., as bottom metal pads 232, 234.

A metal plate 230 is disposed on the bottom surface of bottom layer 201. Metal plate 230, which is advantageously circular and as large as possible in some embodiments, provides a metallic surface for attaching a heat sink. Metal plate 230 is also advantageously electrically isolated from the various electrical paths and pads that may be present on, within, and/or under substrate 200.

Figure 2C:
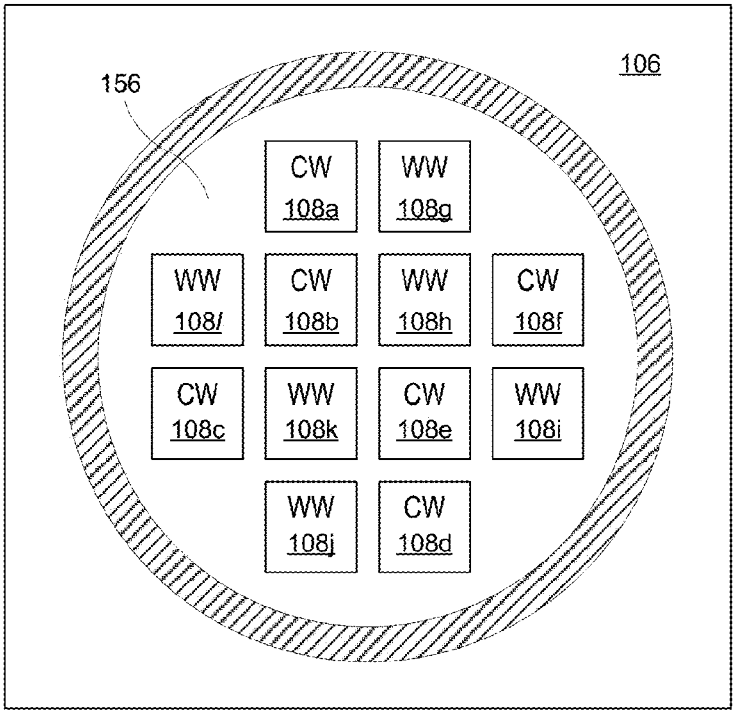
FIG. 2C is a simplified top view of a substrate holding LEDs that may be used in the tunable multi-LED emitter module of FIG. 1.

Substrate 200 can be used to support any number and arrangement of LEDs. Specific examples include 4-LED, 12-LED, and 16-LED configurations. An example is illustrated in FIG. 2C, which is a top view of substrate 106 in FIG. 2A according to an embodiment of the present invention. Those skilled in the art with access to the present teachings will understand that many other configurations are also possible.

In some embodiments LEDs 108 advantageously include both "warm" and "cool" white LEDs. As shown in FIG. 2C, twelve LEDs 108*a*-*l* are arranged within a recess 156 on substrate 106. In this example, six of the LEDs are cool white ("CW") LEDs 108*a*-*f*; the other six are warm white ("WW") LEDs 108*g*-*l*. "Cool" white and "warm" white, as used herein, refer to the color temperature of the light produced. Cool white, for example, can correspond to a color temperature above, e.g., about 4000 K, while warm white can correspond to a color temperature below, e.g., about 3000 K. In some embodiments, it is desirable that cool white LEDs 108*a*-*f* have a color temperature cooler than a target color temperature for lamp 100 while warm white LEDs 108*g*-*l* have a color temperature warmer than the target color temperature. When light from cool white LEDs 108*a*-*f* and warm white LEDs 108*g*-*l* is mixed by mixing lens 112, the target temperature can be achieved. More generally, for purposes of providing a tunable emitter, the emitter can include LEDs belonging to any number of "groups," with each group being defined as producing light within a different color or color temperature range (or "bin"); the ranges associated with different groups advantageously do not overlap, and the desired color or color temperature to which the lamp will be tuned is somewhere between the colors or color temperatures associated with the groups of LEDs.

Figure 2D:
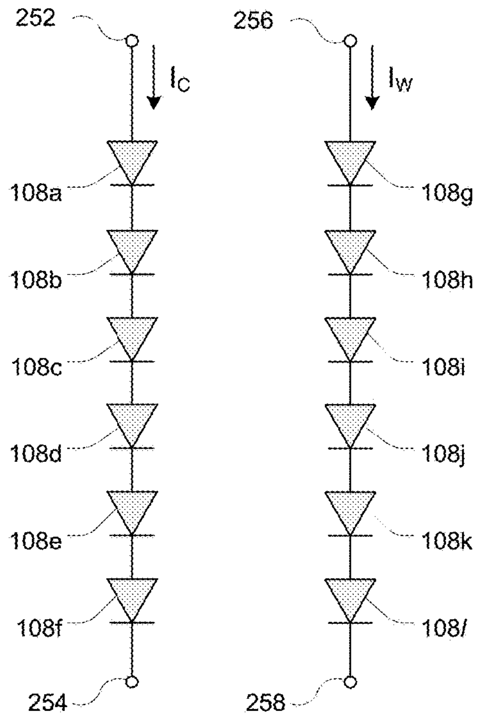
FIGS. 2D and 2E illustrate examples of electrical connectivity that can be used to provide independent addressability of warm white and cool white LEDs according to an embodiment of the present invention.
Figure 2E:
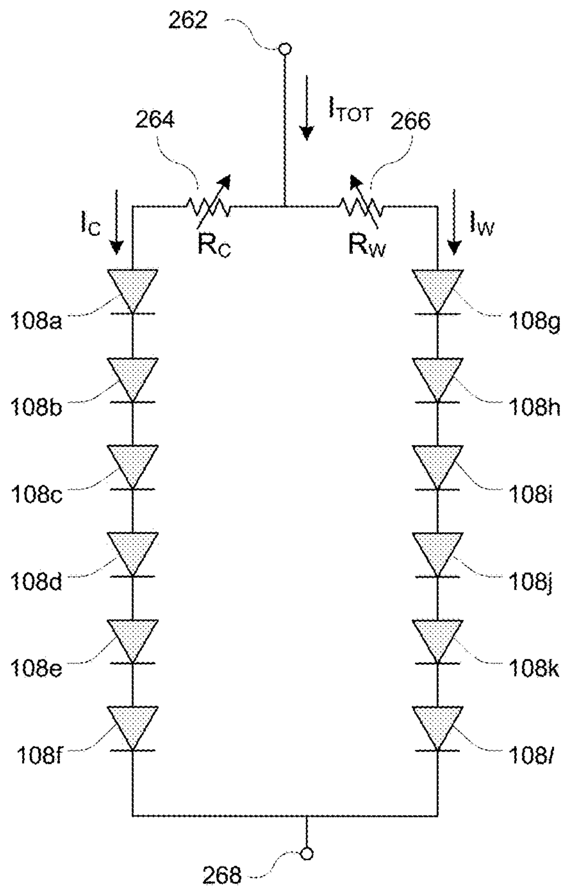

To facilitate achieving a desired color temperature, the LEDs 108 of emitter 120 are advantageously connected such that cool white LEDs 108*a*-*f* and warm white LEDs 108*g*-*l* are independently addressable, i.e., different currents can be supplied to different LEDs. FIGS. 2D and 2E are simplified schematics illustrating examples of electrical connectivity that can be used to provide independent addressability of warm white and cool white LEDs. These electrical connections can be implemented, e.g., using traces disposed on the surface of substrate 106 and/or between electrically insulating layers of substrate 106. Examples of substrates that provide independent addressability for groups of LEDs are described in U.S. patent application Ser. No. 12/756,86, U.S. Patent App. Pub. No. 2010/0259930; other substrates can also be used.

In FIG. 2D, cool white LEDs 108*a*-*f* are connected in series between a first input node 252 and a first output node 254; warm white LEDs 108*g*-*l* are connected in series between a second input node 256 and a second output node 258. Consequently, one current ($I_C$) can be delivered to cool white LEDs 108*a*-*f* while a different current ($I_W$) is delivered to warm white LEDs 108*g*-*l*. The currents $I_C$ and $I_W$ can be independently controlled, thereby allowing the relative brightness of cool white LEDs 108*a*-*f* and warm white LEDs 108*g*-*l* to be controlled; this provides control over the color temperature of light produced by emitter 120. For example, control circuit 116 (FIG. 2A) can be connected to nodes 252 and 254 and to nodes 256 and 258 to deliver the desired currents $I_C$ and $I_W$.

FIG. 2E illustrates one specific technique for implementing per-group current control. As in FIG. 2D, cool white LEDs 108*a*-*f* are connected in series, and warm white LEDs 108*g*-*l* are also connected in series. In FIG. 2E, the last LEDs in each series (LEDs 108*f* and 108*l*) are connected to a common output node 268. A common input node 262 receives a total current $I_{TOT}$, which is divided between cool white LEDs 108*a*-*f* and warm white LEDs 108*g*-*l* using potentiometers (or variable resistors) 264, 266. Potentiometer 264 can be set to a resistance $R_C$ while potentiometer 266 can be independently set to a resistance $R_W$; as a result, a current $I_C$ is delivered to cool white LEDs 108*a*-*g* while a current $I_W$ is delivered to warm white LEDs 108*g*-*l*. By controlling $R_W$ and $R_C$, $I_{TOT}$ can be divided between $I_W$ and $I_C$ in a controllable proportion according to the property that $I_W/I_C=R_C/R_W$. Thus, as in FIG. 2D, the relative brightness of cool white LEDs 108*a*-*f* and warm white LEDs 108*g*-*l* can be controlled, thereby providing control over the color temperature of light produced by lamp 100. In one embodiment, control circuit 116 can be connected to nodes 262 and 268 to supply current $I_{TOT}$, and further connected to control resistances $R_C$ and $R_W$.

Other addressing schemes can also be used; for example, each of the LEDS 108*a*-*l* can be independently addressable.

It will be appreciated that emitter 120 described herein is illustrative and that variations and modifications are possible. In one embodiment, emitter 120 can be similar to the emitter in a LuxSpot™ lamp, manufactured and sold by LedEngin Inc., assignee of the present invention. Those skilled in the art with access to the present teachings will recognize that any lamp that has independently addressable warm white and cool white LEDs can also be used; thus, details of the lamp are not critical to understanding the present invention.

In accordance with some embodiments of the present invention, the currents $I_C$ and $I_W$ (shown in FIGS. 2D and 2E) can be efficiently tuned so that the light output from emitter 120 has a desired color temperature. The tuning process advantageously requires only a small number (e.g., three or four) of measurements and does not rely on trial-and-error. The process can also be automated to allow tuning of a large number of lamps in a mass-production environment; thus, color tuning can be incorporated into lamp production, e.g., as a stage in an assembly line.

As described below, emitter 120 can be placed into a tuning apparatus and color-tuned during production. Thereafter, emitter 120 can be configured to operate at the desired color temperature simply by maintaining the division (or distribution) of current determined in the tuning process. Provided that the LEDs in emitter 120 can maintain a stable color temperature over time, no further tuning or active feedback is needed during normal emitter operation. Since active feedback is not needed, the cost of manufacture can be reduced as compared to emitters that require active feedback to maintain a stable color temperature.

The tuning process can also be used to identify different current distributions for different target colors. A tunable multi-LED emitter module (e.g., emitter module 100 of FIG. 1) can include a memory device containing at least information associating two or more output light colors with two or more corresponding combinations of electrical current values, each combination specifying an electric current for each of the two or more groups of LEDs. A tuning process according to embodiments of the present invention is described in more detail below with reference to FIGS. 3A and 3B.

Figure 3A:
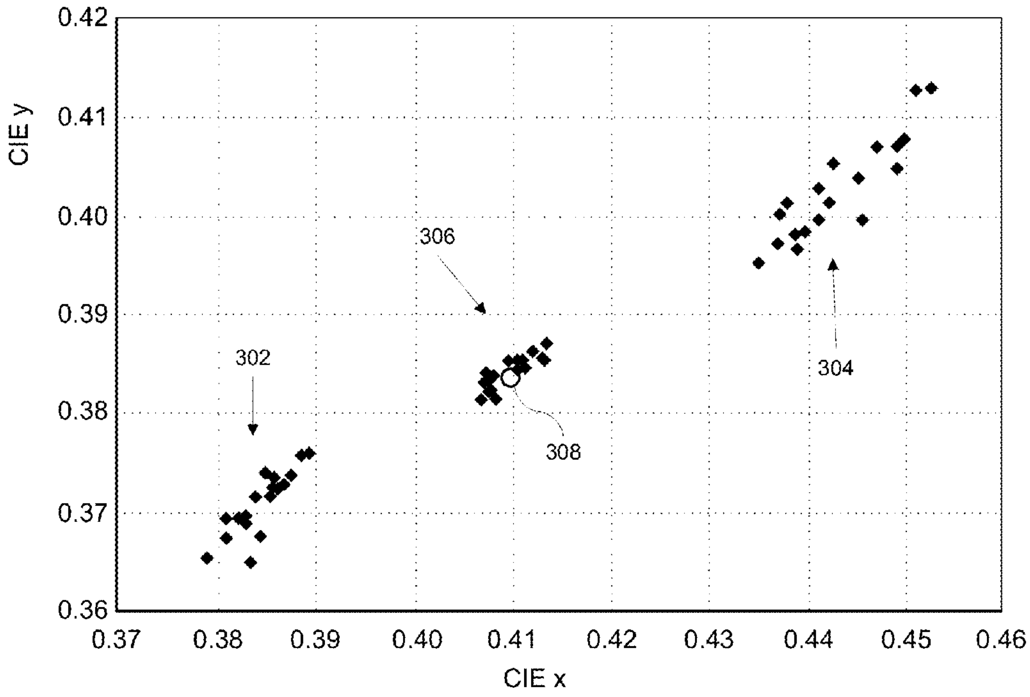
FIG. 3A is a plot illustrating operating characteristics of LED lamps usable in some embodiments of the present invention.

FIG. 3A is a plot illustrating operating characteristics of emitters usable in some embodiments of the present invention. The graph 300 represents a portion of CIE color space, which characterizes light in terms of luminance (CIE y) and chromaticity (CIE x) coordinates. The portion of the CIE color space represented encompasses much of the range associated with white light. The various data points (black diamonds) represent colors measured from a number of LED-based emitters having independently addressable warm white and cool white LED groups, e.g., as described above with reference to emitter 120, under various operating conditions.

More specifically, for purposes of these measurements, a total current $I_{TOT}$ of 1000 mA was supplied to the emitter, and the constraint $I_C+I_W=I_{TOT}$ was maintained. "Cool white" data, represented by points 302, was measured for each emitter by setting $I_C=I_{TOT}$ and $I_W=0$. "Warm white" data, represented by points 304, was measured for each emitter by setting $I_C=0$ and $I_W=I_{TOT}$. "Balanced" data, represented by points 306, was measured by setting $I_C=I_W=0.5*I_{TOT}$.

A target color is represented by circle 308, and the goal is to produce colors as close to this target as possible. As can be seen, merely applying equal current to the warm white and cool white LEDs results in balanced data points 306 being scattered about target 308. While the balanced colors are more consistent across different emitters than can readily be obtained by using LEDs of a single white color, further improvement in color consistency can be achieved by tuning the relative currents $I_C$ and $I_W$ (and consequently the color) on a per-emitter basis. Such tuning in a typical case results in unequal currents being supplied to the warm white and cool white LEDs, with the currents being selected to reduce the lamp-to-lamp variation by bringing the light from each emitter closer to target 308.

Figure 3B:
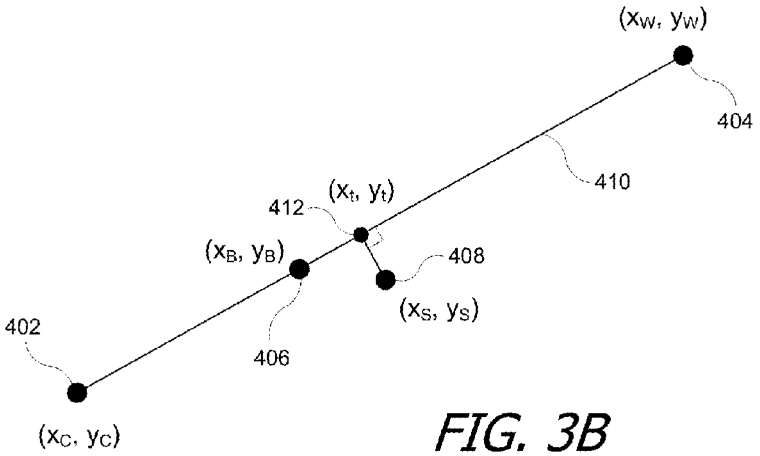
FIG. 3B illustrates an operating principle for tuning an LED lamp according to an embodiment of the present invention.

FIG. 3B illustrates an operating principle for tuning an emitter according to an embodiment of the present invention. Point 402, at coordinates $(x_C, y_C)$ in CIE color space, represents the location of a "cool white" data point for a particular emitter (e.g., one of data points 302 in FIG. 3A). Similarly, point 404, at coordinates $(x_W, y_W)$ in CIE color space, represents the location of a "warm white" data point for the same emitter (e.g., one of data points 304 in FIG. 3A). Point 406, at coordinates $(x_B, y_B)$ represents the balanced data for that emitter (e.g., one of data points 306). Point 408, at coordinates $(x_s, y_s)$, represents a single-color point to which it is desirable to tune the emitter. (This point, which can correspond to target 308 in FIG. 3A, may be specified by the manufacturer of the lamp or any other entity who may be performing the tuning process.)

Blending light of the colors corresponding to points 402 and 404 results in a color somewhere along line 410. Thus, it may not be possible to produce blended light with a color corresponding exactly to single-color point 408. Accordingly, the aim instead is to reach the closest point to point 408 that is on line 410, i.e., "tuned" point 412 at coordinates $(x_t, y_t)$. In a typical case $(x_t, y_t)$ and $(x_B, y_B)$ are not the same, and $(x_t, y_t)$ may be different for different lamps; thus, tuning on a per-emitter basis is desired.

In general, the relationship between a change in the relative currents (measured, e.g., as $I_W/I_C$) supplied to the warm and cool LEDs and the resulting shift in color temperature is nonlinear. Further, the magnitude of the shift in color temperature resulting from a given change in relative current varies from one lamp to another. However, according to embodiment of the invention, over a sufficiently narrow range of color space, the relationship can be approximated as linear. Examples of tuning techniques based on this property are described in U.S. patent application Ser. No. 13/106,808, filed May 12, 2011, entitled "Tuning Of Emitter With Multiple LEDS To A Single Color Bin," now U.S. Pat. No. 8,598,793.

Figure 4A:
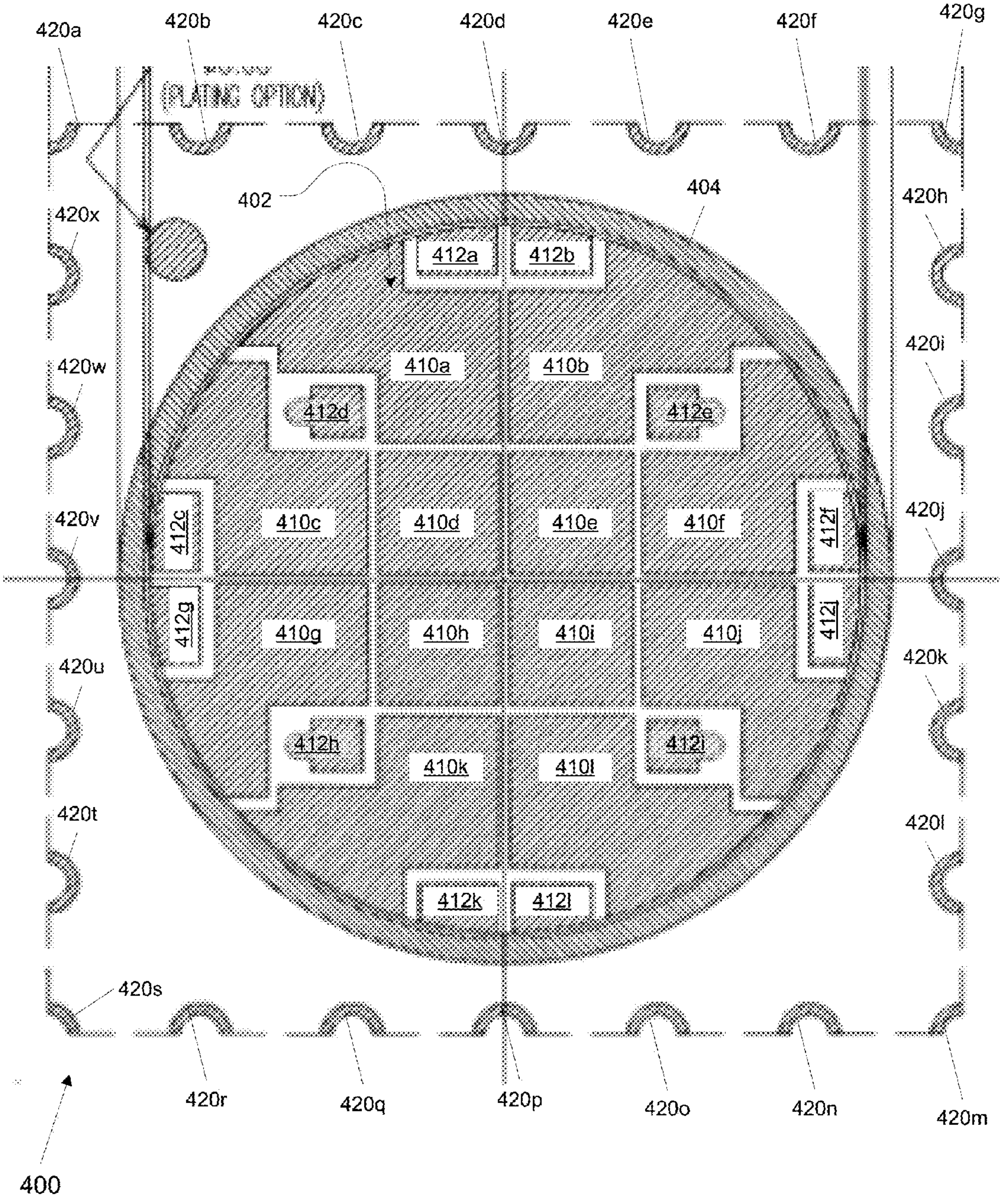
FIGS. 4A-4D illustrate a 12-LED package according to an embodiment of the present invention. More specifically.

In embodiments of the invention, the tuning is facilitated by arranging the substrate to provide individual access and control of the LED dies. FIG. 4A is a simplified top view of a substrate 400 for a 12-LED package according to another embodiment of the present invention. Substrate 400, viewed from the top, can be a square of any size desired, e.g., about 0.7-5 cm on a side; in one embodiment, the square is about 9 mm on a side. Its thickness can be, e.g., about 0.5-2 mm or other thickness as desired; in one embodiment, the thickness is between 0.7-1 mm. Like substrate 200 of FIG. 2B, substrate 400 is formed as a set of ceramic layers. A recess 402 is defined by an angled sidewall 404 and optionally surrounded by a ledge (not explicitly shown), similar to recess 210 and ledge 212 of FIG. 2B. Top-side bond pads, which include LED bond pads 410*a-l* and wire bond pads 412*a-l*, are disposed within the recess. In this embodiment, twenty-four peripheral bond pads 420*a-x* are provided for external electrical contacts. Twelve LEDs (not shown in FIG. 4A) can be bonded to LED bond pads 410*a-l* and connected, e.g., via wire bonds, to wire bond pads 412*a-l*, as shown in FIG. 4B and described below.

Depending on how the LEDs are connected and how top-side bond pads 410*a-l*, 412*a-l* are electrically coupled to peripheral bond pads 420*a-x*, a number of electrical configurations are possible.

Figure 4B:
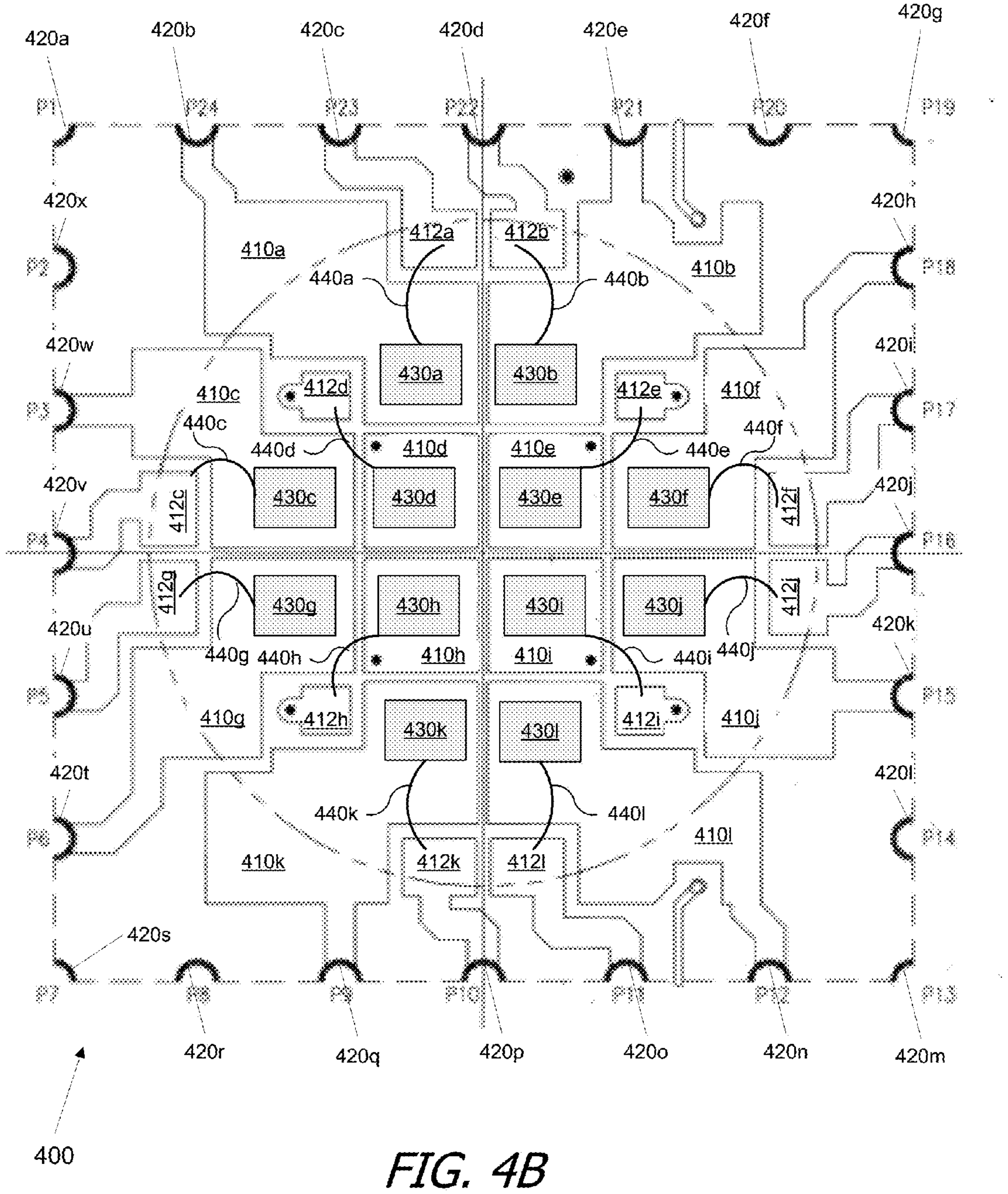

For example, FIG. 4B is a cutaway top view of substrate 400, with the upper layers forming sidewall 404 (e.g., corresponding to layers 204 and 205 of FIG. 2B) removed. The inner periphery of recess 402 is indicated by broken line 403. As can be seen, some of top-side bond pads 410*a-l*, 412*a-l* can extend outward beyond the boundary of recess 402, further spreading heat across more of the upper surface of ceramic substrate 400. In addition, some of top-side bond pads 410*a-l*, 412*a-l* can connect to some of peripheral bond pads 420*a-x* without the use of vias or metal interconnects between other layers. Connections to the remaining bond pads are not explicitly shown in FIG. 4B. It is to be understood that paths not shown in FIG. 4B may be implemented using vias and metal interconnect between the ceramic layers (e.g., as illustrated in FIG. 2B). For example, metal interconnects may be created on a layer below the layer seen in FIG. 4B and connected to the various pads by vias.

FIG. 4B also shows how twelve LEDs 430*a-l* can be placed and electrically connected to substrate 400 according to an embodiment of the present invention. In this embodiment, each of LEDs 430*a-l* has an electrical contact on its bottom surface (not explicitly shown) and a top pad (also not explicitly shown) for a wire bond 440*a-l*.

The pad configuration of FIG. 4B can provide a separate, independently controllable, electrical connection path for each of the twelve LEDs 430*a-l*. (Herein, LEDs or groups of LEDs with a separate electrical connection path are referred to as being "independently addressable.") For example, peripheral bond pad 420*b* connects to LED bond pad 410*a*. LED 430*a* is connected between LED bond pad 410*a* and wire bond pad 412*a* by wire bond 440*a*. Wire bond pad 412*a* connects to peripheral bond pad 420*c*. Likewise, peripheral bond pad 420*w* connects to LED bond pad 410*c*. LED 430*c* is connected between bond pad 410*c* and bond pad 412*c* by wire bond 440*c*. Bond pad 412*c* is connected to peripheral bond pad 420*v*. Further, peripheral bond pad 420*x* connects to LED bond pad 410*d* (the connection is not explicitly shown). LED 430*d* is connected between LED bond pad 410*d* and wire bond pad 412*d* by wire bond 440*d*. Wire bond pad 440*d* connects to peripheral bond pad 420*a* (again, the connection is not explicitly shown). Similarly, each other LED 430 is electrically coupled between a different pair of peripheral bond pads.

Figure 4C:
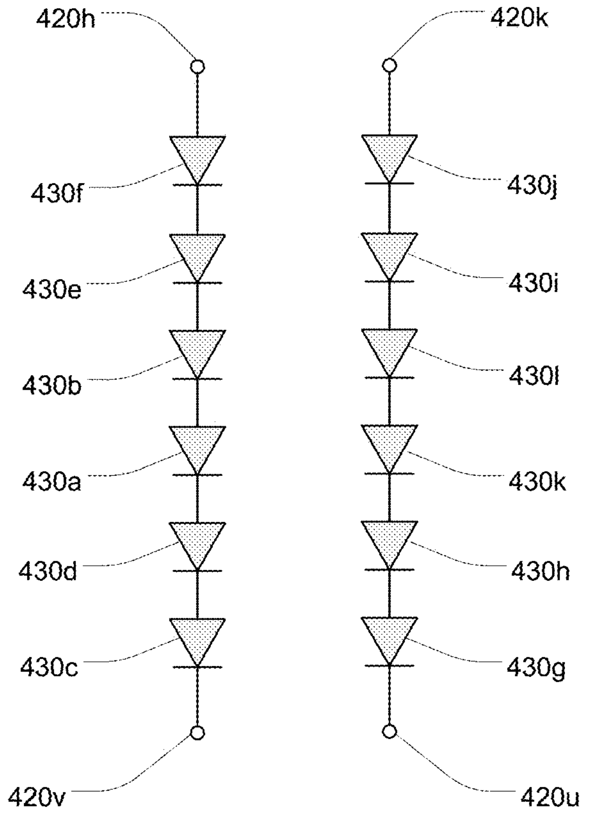

Thus, LEDs 430*a-l* are each individually addressable; this is also illustrated schematically in FIG. 4C. In this configuration, applying a potential difference across the appropriate pair of peripheral bond pads will provide power to one of the twelve LEDs 430*a-l*. The individually addressable connections to the LEDs provide flexibility to make connections outside of the package and thereby connect the LEDs together in different groups. For example, LEDs 430*a-l* could be connected into four groups of three LEDs each or two groups of six LEDs each. The LEDs within a group can be connected in series or in parallel as desired. For example, FIG. 4C is a schematic diagram illustrating a configuration with two groups of six LEDs 430*a-l* connected in series according to an embodiment of the present invention.

In still other embodiments, series or parallel connections of multiple LEDs can be "built in" to the substrate. For example, if a wire bond pad (e.g., pad 412*d*) were electrically connected to an LED bond pad (e.g., pad 410*c*), a serial connection would be permanently defined for LEDs 430*c*, 430*d*. Such a connection can be made directly between the pads, or indirectly using vias and metal interconnects between base layers of substrate 400.

Referring again to FIG. 4B, it should be noted that LED bond pads 410*a-l* are advantageously made as large as possible and can be substantially larger than LEDs 430*a-l*. The large area of the LED bond pads allows heat generated by LEDs 430*a-l* to spread quickly across the upper surface of the ceramic substrate, increasing the amount of heat that can be transferred vertically through the substrate.

Figure 4D:
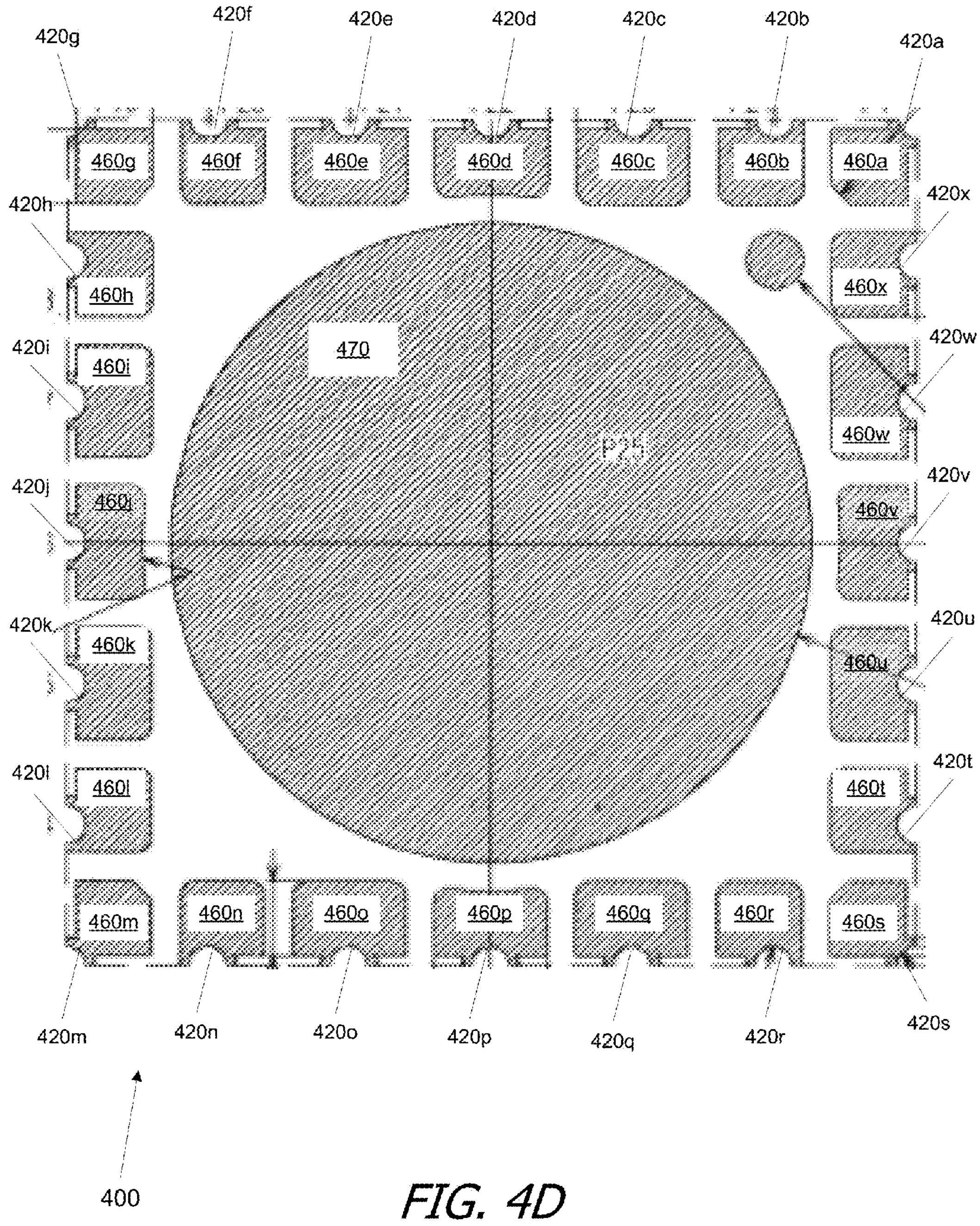

FIG. 4D is a bottom view of substrate 400 of FIG. 4A. A metal region 470, which is advantageously circular and as large as possible is centered relative to recess 402 (FIG. 4A). Metal region 470 acts as a heat dissipation plate. A heat sink can be placed in thermal contact with metal region 470 to further dissipate heat.

Peripheral bond pads 420*a-x* can extend along the entire vertical thickness of substrate 400 (similar to substrate 200 of FIG. 2A) and can be connected to bottom pads 460*a-x*. External electrodes (e.g., wires) can be connected directly to peripheral bond pads 420*a-x* and/or to bottom pads 460*a-x* as desired.

It should be noted that metal region 470 is not electrically coupled to any of peripheral bond pads 420*a-x*, bottom pads 460*a-x*, or top-side bond pads 410*a-l*, 412*a-l*. Thus, metal region 470, in conjunction with the thermally conductive ceramic body of substrate 400, provides a thermal path that is separate from the electrical path.

Figure 5:
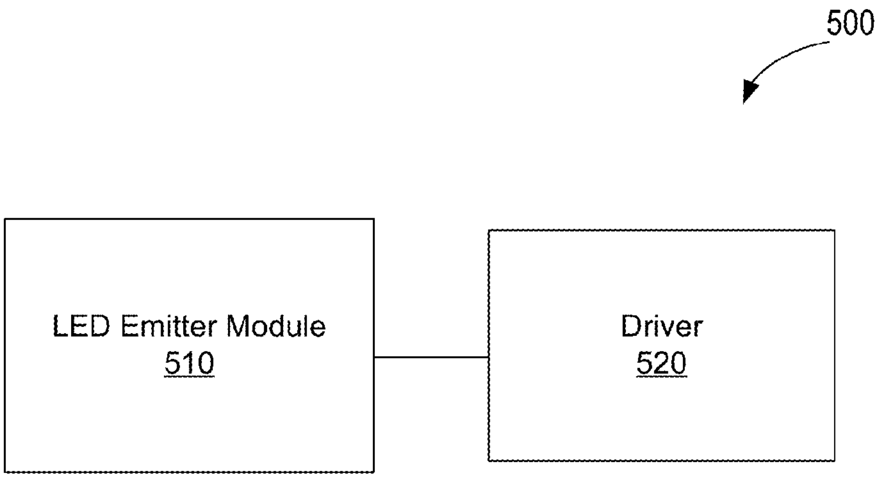
FIG. 5 illustrates a lighting system including a tunable multi-LED emitter module according to an embodiment of the present invention.

FIG. 5 illustrates a lighting system 500 including a tunable multi-LED emitter module according to an embodiment of the present invention. As shown in FIG. 5, lighting system 500 includes a tunable multi-LED emitter module 510 and a driver module 520. In an embodiment, tunable multi-LED emitter module 510 is similar to tunable multi-LED emitter module 100 of FIG. 1. In particular, emitter module 510 includes two or more groups of LEDs, memory device. Driver module 520 includes a power supply, e.g., a switch mode power supply (SMPS), that has multiple channels for providing a separate current to each groups of LEDs. Driver module 520 also includes control circuits configured for accessing the information in the memory device in emitter module 510 and adjusting the current output in each channel for tuning the emitter module to provide the target light color.

Figure 6:
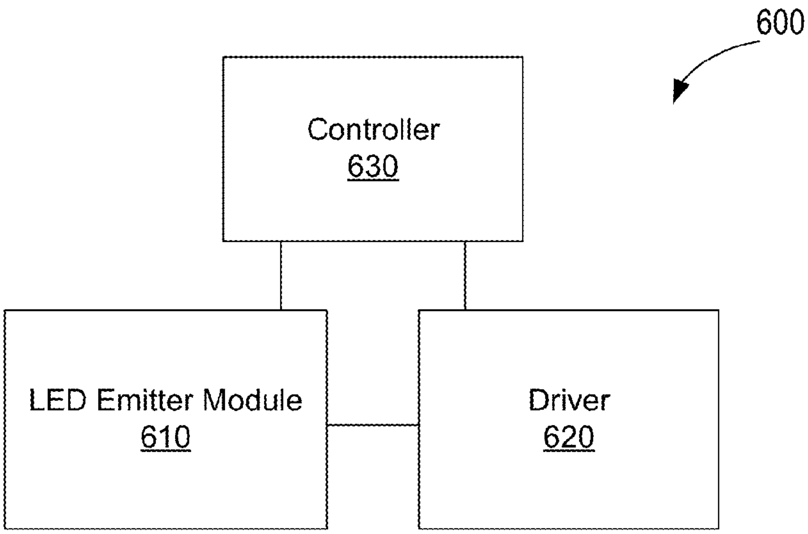
FIG. 6 illustrates another lighting system including a tunable multi-LED emitter module according to another embodiment of the present invention.

FIG. 6 illustrates anther lighting system 600 including a tunable multi-LED emitter module according to an embodiment of the present invention. As shown in FIG. 6, lighting system 600 includes a tunable multi-LED emitter module 610, a driver module 620, and a controller 630. Tunable multi-LED emitter module 610 is similar to tunable multi-LED emitter module 100 of FIG. 1. In an embodiment, controller 630 includes a processor that is configured to read information stored in the memory device in emitter module 610 and determine the output for each channel of driver module 620 for tuning the light output of emitter module 610.

In some embodiments, controller 630 is coupled to emitter module 610 and driver module 620 through wire connections. In some other embodiments, controller 630 can be coupled to emitter module 610 and driver module 620 through wireless communications.

Figure 7:
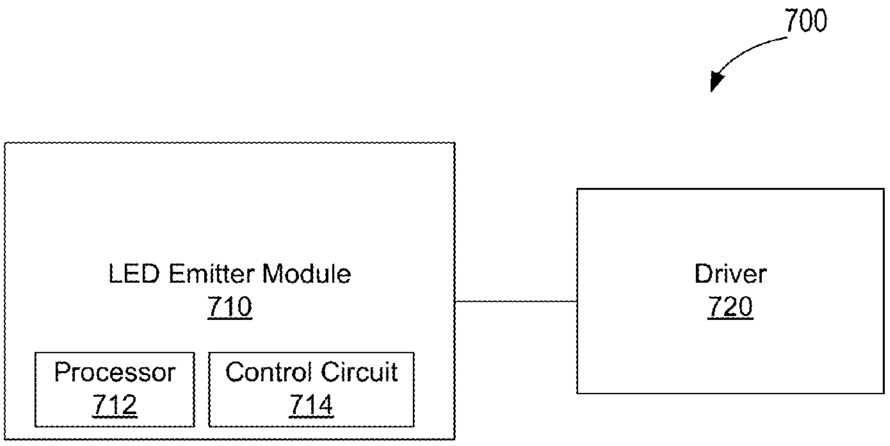
FIG. 7 illustrates yet another lighting system including a tunable multi-LED emitter module according to an alternative embodiment of the present invention.

FIG. 7 illustrates yet another lighting system 700 including a tunable multi-LED emitter module according to an embodiment of the present invention. As shown in FIG. 7, lighting system 700 includes a tunable multi-LED emitter module 710 and a driver module 720. In some embodiments, tunable multi-LED emitter module 710 is similar to tunable multi-LED emitter module 100 of FIG. 1. In addition, emitter module 710 also includes a processor 712 and a current control circuit 714. In some embodiments, driver module 720 can be a conventional driver circuit with a power supply. In this case, the currents to each group of LEDs can be adjusted by current control circuit in emitter module 710. For example, processor 712 can access the information from the memory device in emitter module 710 and direct control circuit 714 to distribute the current received from driver module 720 to each group of LEDs in emitter module 710. In some embodiments, emitter module 710 can receive information to be written into the memory device through wired or wireless communication with an external system. For example, emitter module 710 can receive, from an external test system, electrical current and light color information that is calibrated to the groups of LEDs in this emitter module for color tuning.

Figure 8:
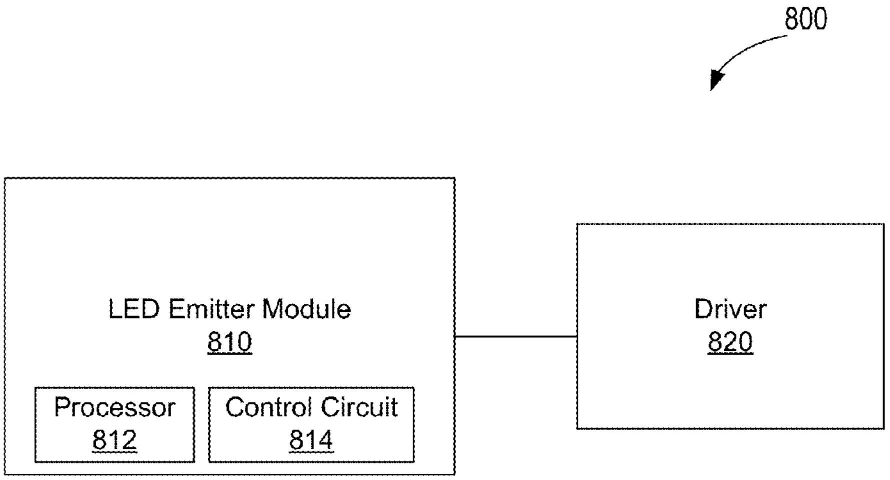
FIG. 8 illustrates yet another lighting system including a tunable multi-LED emitter module according to an alternative embodiment of the present invention.

FIG. 8 illustrates a lighting system 800 including a tunable multi-LED emitter module according to an embodiment of the present invention. As shown in FIG. 8, lighting system 800 includes a tunable multi-LED emitter module 810 and a driver module 820. In some embodiments, emitter module 810 is similar to emitter module 710 in lighting system 700, and includes a processor 812 and a control circuit 814. In FIG. 8, control circuit 814 includes a PWM (Pulse Width Modulation) controller for controlling driver module 810. In this case, driver module 820 includes the necessary components of a power supply, such as a transformer, power transistor, output rectifier, etc.

Figure 9:
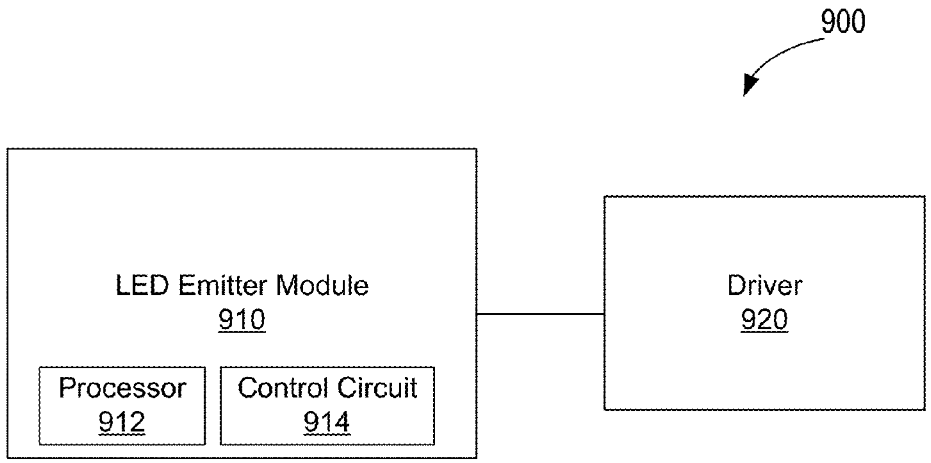
FIG. 9 illustrates yet another lighting system including a tunable multi-LED emitter module according to an alternative embodiment of the present invention.

FIG. 9 illustrates another lighting system 900 including a tunable multi-LED emitter module according to an embodiment of the present invention. As shown in FIG. 9, lighting system 900 includes a tunable multi-LED emitter module 910 and a driver module 920. In some embodiments, emitter module 910 is similar to emitter module 710 in lighting system 700, and includes a processor 912 and a control circuit 914. Driver module 920 can be a conventional power supply, e.g., an SMPS. Here, control circuit 914 includes an analog current splitter circuit that can distribute the current received from driver module 920 for tuning light output of emitter module 910.

In the above description, specific circuits and examples are used to illustrate the embodiments, it is understood that the examples and embodiments described herein are for illustrative purposes only and that various modifications or changes in light thereof will be suggested to persons skilled in the art and are to be included within the spirit and purview of this invention.

What is claimed is:

1. A method for making a light-emitting diode (LED) emitter module, comprising:

providing a substrate having a plurality of electrical contacts and a plurality of electrical paths coupled to the electrical contacts;

providing two or more groups of LED dies disposed on the substrate, each group having one or more LED dies, each of the LED dies being coupled to an electrical contact, wherein the electrical paths are configured for feeding separate electrical currents to the groups of LED dies;

placing a primary lens over the two or more groups of LED dies;

determining information associating a plurality of output light colors with a corresponding plurality of combinations of electrical currents, each combination specifying a plurality of electrical current values, each electrical current value being associated with one of the two or more groups of LED dies;

providing a memory device on the substrate;

storing the information in the memory device; and providing a circuit for accessing the information in the memory device.

2. The method of claim 1, wherein the memory device is a non-volatile memory device.

3. The method of claim 1, wherein the output light color is specified by a target wavelength within a wavelength range of no more than 10 nm.

4. The method of claim 1, further comprising providing a circuit for wired communication for the emitter module to receive information from an external system to be written into the memory device.

5. The method of claim 1, further comprising providing a circuit for wireless communication for the emitter module to receive information from an external system to be written into the memory device.

6. The method of claim 1, further comprising providing a processor configured to read information stored in the memory device and to determine the electrical current to be provided to each of the two or more groups of LED dies.

7. The method of claim 1, further comprising providing a processor and a PWM (pulse width modulation) control circuit, wherein the processor is configured to read information stored in the memory device, to determine the electrical current to be provided to each of the two or more groups of LED dies, and to control the PWM control circuit to deliver the electrical current to each of the two or more groups of LED dies.

8. The method of claim 1, further comprising providing a processor and an analog current splitter circuit, wherein the processor is configured to read information stored in the memory device, to determine the electrical current to be provided to each of the two or more groups of LED dies, and to control the analog current splitter circuit to deliver the electrical current to each of the two or more groups of LED dies.

9. The method of claim 1, wherein the sum of the electrical current values for each combination of the electrical currents is equal to a total current value.

10. The emitter module of claim 1, further comprising disposing the circuit for accessing the information in the memory device on the substrate.

11. The method of claim 1, wherein each of the LED dies in a first one of the two or more groups of LED dies is configured to provide cool white light, and each of the LED dies in a second one of the two or more groups of LED dies is configured to provide warm white light.

* * * * *